US007372188B2

(12) United States Patent
Thies

(10) Patent No.: US 7,372,188 B2
(45) Date of Patent: May 13, 2008

(54) METHOD AND APPARATUS FOR CONTROLLING A FUEL-INJECTION VALVE

(75) Inventor: Harald Thies, Garching (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 11/590,748

(22) Filed: Nov. 1, 2006

(65) Prior Publication Data

US 2007/0046146 A1 Mar. 1, 2007

Related U.S. Application Data

(63) Continuation of application No. PCT/EP2005/004436, filed on Apr. 26, 2005.

(30) Foreign Application Priority Data

May 6, 2004 (DE) ...................... 10 2004 022 371

(51) Int. Cl.
*H01L 41/08* (2006.01)
*H01L 41/04* (2006.01)

(52) U.S. Cl. .................. 310/317; 310/316.01; 310/328

(58) Field of Classification Search ................ 310/328, 310/311, 316–317
See application file for complete search history.

(56) References Cited

U.S. PATENT DOCUMENTS 6,318,342 B1 11/2001 Simon et al.
6,840,237 B2 * 1/2005 Strom et al. ................ 123/684

FOREIGN PATENT DOCUMENTS

| | | | |
|---|---|---|---|
| DE | 39 35 937 | A1 | 5/1990 |
| DE | 196 22 651 | A1 | 12/1996 |
| DE | 199 03 721 | C1 | 7/2000 |
| DE | 199 60 971 | A1 | 3/2001 |
| DE | 199 63 134 | A1 | 6/2001 |
| DE | 100 32 022 | A1 | 1/2002 |
| DE | 101 27 932 | A1 | 12/2002 |
| DE | 102 36 615 | A1 | 2/2004 |
| EP | 1 235 283 | B1 | 8/2002 |
| JP | 56113044 | A * | 9/1981 |
| JP | 61232381 | A * | 10/1986 |

OTHER PUBLICATIONS

International Search Report dated Jul. 8, 2005, including English translation thereof. (Six (6) pages).
German Office Action dated Apr. 19, 2005, including English translation of pertinent portion. (Eight (8) pages).

* cited by examiner

*Primary Examiner*—J. San Martin
(74) *Attorney, Agent, or Firm*—Crowell & Moring LLP

(57) ABSTRACT

A fuel injection valve is controlled, the valve includes a piezoelectric actuator as the valve member, which opens up or closes a connection to a space arranged downstream, an electric actuating element for actuating the valve member and a prestressing element which prestresses the valve member into a prestressing direction. A sensor element, which is arranged on the same axis as the valve member supplies an output signal to a control unit concerning the forces acting upon the valve member. The control unit acts upon the actuating element by way of an electric excitation, which has a signal course at least approximately inverse to the output signal of the sensor element.

7 Claims, 1 Drawing Sheet

1

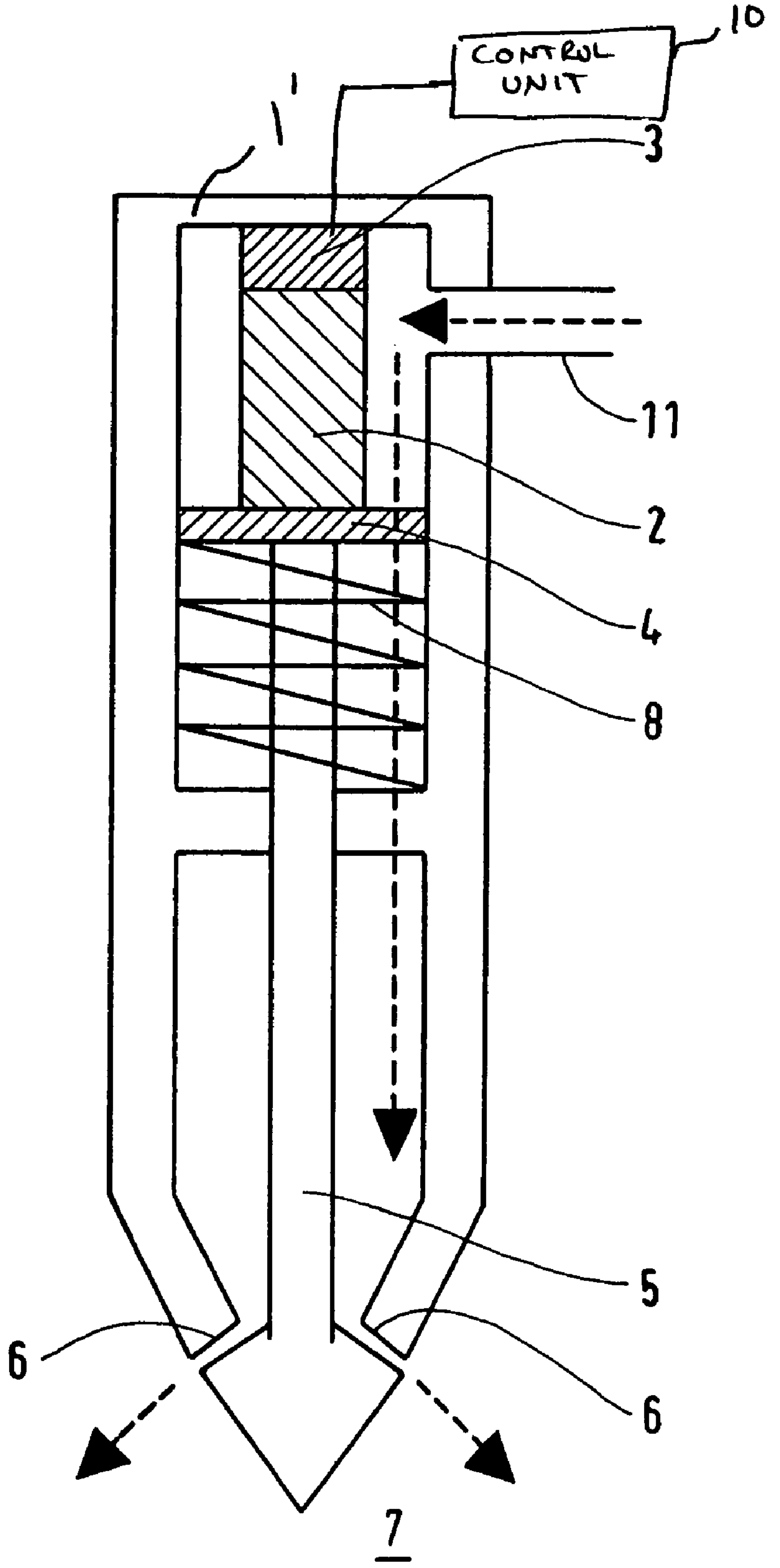
1

METHOD AND APPARATUS FOR CONTROLLING A FUEL-INJECTION VALVE

CROSS-REFERENCE TO RELATED APPLICATIONS

This application is a continuation of PCT International Application No. PCT/EP2005/004436, filed on Apr. 26, 2005, which claims priority under 35 U.S.C. § 119 to German Application No. 10 2004 022 371.8, filed May 6, 2004, the entire disclosures of which are expressly incorporated by reference herein.

BACKGROUND AND SUMMARY OF THE INVENTION

The present invention relates to a method and apparatus for controlling a fuel injection valve having a piezoelectric actuator as the valve member, which opens up or closes a connection to a space arranged downstream. An electric actuating element actuates the valve member and a prestressing element prestresses the valve member into a prestressing direction. Furthermore, a sensor element is arranged on the same axis as the valve member and supplies an output signal to a control unit concerning the forces acting upon the valve member.

Such an operation is known from German Patent document DE 101 27 932 A. The sensor element is to be used for determining any engine knocking. The mechanical impulses are converted to electric signals by way of the sensor element. These signals are evaluated by the control device. However, in this case, it should only be possible to detect the pressure via the sensor element only in the inactive phase of the valve (completely open valve or completely closed valve).

There is therefore needed a method and apparatus of the above-mentioned type which allows for reliable control of the fuel injection valve during the entire combustion process.

The present invention achieves this object by providing a method and apparatus for controlling a fuel injection valve, including a piezoelectric actuator as the valve member, which opens up or closes a connection to a space arranged downstream. An electric actuating element actuates the valve member and a prestressing element prestresses the valve member into a prestressing direction. Furthermore, a sensor element is arranged on the same axis as the valve member and supplies an output signal to a control unit concerning the forces acting upon the valve member. The control unit acts upon the actuating element by way of an electric excitation, which has a signal course (phase) at least approximately inverse to the output signal of the sensor element.

The prerequisite of the invention is the special construction of the fuel injection valve. The piezoelectric actuator and the sensor element preferably form a unit. In addition, a prestressing element for the piezoelectric actuator is provided, which prestresses the valve member into a prestressing direction, preferably in a closing manner. The sensor element is on the same axis as the valve member. The output signal will then supply information concerning the forces acting upon the valve member.

These forces are composed of the force exercised by the prestressing element, the force acting upon the piezoelement by electric excitation, the force acting upon the valve by the combustion pressure in the combustion chamber, as well as possible thermal influences. The force acting upon the valve, if correspondingly dimensioned, as a result of the combustion pressure in the combustion chamber, is clearly lower than the force exercised by the prestressing element and the force acting by electric excitation on the piezoelement.

The signal course of the electric power by which the actuating element is acted upon is characteristic of the invention. By means of the signal course, which is at least approximately inverse to the output signal of the sensor element, it is to be achieved that, during the entire opening time, apart from the opening and closing operation, the piezoelectric actuator remains in an at least approximately invariable position.

Within the scope of the invention, a sensor element is preferably used which, like the piezoelectric actuator, has an electrostrictive construction and is preferably arranged together with it on a joint axis with the valve member. The above-mentioned effect can also be obtained if the sensor element is constructed as a magnetostrictive element. As a result, a particularly compact construction is achieved.

Instead of an electrostrictive element, a magnetostrictive element may also be used. In the case of magnetostrictive elements, the geometrical dimensions of a body change under the influence of a magnetic field. The expansion of the body takes place as a function of the magnetic field intensity. The expansion of the body is the larger, the greater the magnetic field intensity. The reversal of this effect is called a magnetoelastic or magnetomechanical effect. In this case, a change of the magnetic induction is caused under the influence of a mechanical tension. In the case of the present invention, this may be used for the application of the magnetostrictive element in the manner of an actuator, as well as in the manner of a sensor. Here, the forces are transmitted by way of the valve member to the magnetostrictive element and can be determined there corresponding to the piezoelectric element on the basis of the occurring change of the magnetic induction. As a result, a magnetostrictive element may also operate in the manner of an actuator, as well as in the manner of a sensor.

In a preferred embodiment of the invention, the actuating elements of several valve members, each equipped with sensor elements, are acted upon by an electric excitation inverse to the output signal of the respective sensor elements by way the control unit in an initial operating phase. Several fuel injection valves in several cylinders are thereby controlled independently of one another and in a mutually identical manner.

A further improvement of the method according to the invention is obtained if, in an operating phase following the initial operating phase, the control unit acts upon the actuating elements of several valve member independently of one another by way of an electric excitation inverse to the output signal of the respective sensor element and the amplitudes of the excitation are selected corresponding to the output signal of a cylinder-selective lambda sensor. This results in a controlling of the fuel injection valves as a function of the output signal of the lambda probe(s) with the possibility of still better control of the fuel injection valves in the sense of an optimizing of the exhaust gas action.

Other objects, advantages and novel features of the present invention will become apparent from the following detailed description of the invention when considered in conjunction with the accompanying drawings.

BRIEF DESCRIPTION OF THE DRAWING

The single FIGURE is a schematic sectional view of a fuel injection valve with a piezoelectric actuator and an integrated sensor element particularly suitable for the method according to the invention.

DETAILED DESCRIPTION OF THE DRAWING

As illustrated in the FIGURE, the fuel injection valve 1 includes a piezoelectric actuator 2, as well as a separate piezoelectric sensor 3. The actuator 2 and the sensor 3 are arranged directly adjacent to one another and are positioned between the housing 1' of the valve 1 and a plate-type element 4. The element 4 is fixedly connected with a valve member 5, which opens up or closes a valve seat 6 in order to establish a connection to a combustion chamber 7. In this case, the actuator 2 presses on a spring 8, which holds the valve member 5 in the inoperative condition in the valve seat 6. The spring 8 thereby restores the piezoelectric actuator 2, as well as the valve member 5.

By way of a fuel feed pipe 11, pressurized fuel is fed into a forward area of the valve member 5 (shown by a dotted line).

The method of operating the valve 1 illustrated in the FIGURE is such that, when triggered, the piezoelectric actuator 2 extends its length in the direction of the spring 8, so that the valve member 5 (fixedly connected with the piezoelectric actuator 2) lifts off its valve seat 6 and a fuel injection can take place into the combustion chamber 7.

The occurring forces, for example, caused by pressure changes in the combustion chamber 7, for example, by knocking, are transmitted to the piezoelectric sensor 3 by way of the valve member 5.

Likewise, the forces triggered during the excitation of the piezoactuator 2, as well as the thermal forces occurring at the piezoactuator, are transmitted to the piezoelectric sensor 3. The resultant of all forces occurring there is transmitted (shown schematically) as a signal to a control unit 10. In this case, the same line can be used as the one provided for triggering the piezoactuator 2.

According to the invention, the triggering of the piezoelectric actuator 2 in an initial operating phase takes place such that the control unit acts upon the piezoelectric actuator 2 by way of an electric excitation, which at least approximately has a signal course inverse to the output signal of the sensor 3. The ratio of the two electric signals is equal to a cylinder-individual amplification factor, which is defined by a characteristic diagram. As a result, it is achieved that, during the entire opening time, apart from the opening and closing operation, the piezoelectric actuator 2 remains in an at least approximately invariable position.

In this initial operating phase, the piezoelectric actuators of several valve members, each equipped with corresponding sensor elements, which piezoelectric actuators are provided for several cylinders, corresponding to the method described above for one piezoactuator, are acted upon independently of one another by way of an electric excitation inverse to the output signal of the respective sensor element.

The above results in a lift equalization of the injection valves of several cylinders and, thus, the fuel supply to the cylinders becomes more uniform. In this case, lift equalization alternatively should be understood to be a metrologically identical lift of the valves or a lift of the injection valves which is "identical" in that it aims at the same fuel flow rate, that is, is not necessarily physically identical.

Finally, in an operating phase following the initial operating phase, by using the control unit, the actuating elements of several valve members are acted upon independently of one another by way of an electric excitation inverse with respect to the output signal of the respective sensor element. The amplitudes of the excitation are selected corresponding to the output signal of a cylinder-selective lambda sensor.

This results in a lambda equalization; that is, the fuel-air mixture becomes more uniform over all cylinders.

As an alternative to the two above-mentioned operating modes, a measuring of the fuel flow rates m* apportioned to the respective cylinders may take place during the operation. In this case, the fuel quantity injected into the respective cylinders has to be determined by use of an active lambda probe. For this purpose, only one fuel injection valve, respectively, is opened, and this method of operation is carried out in a rolling manner for the cylinders assigned to the lambda probe. Furthermore, a cross-comparison between the individual fuel injection valves is carried out. This check takes place during a "lean coasting phase" of the internal-combustion engine. As a result, an unacceptable engine operation can be avoided. As a result of this checking method, an individual lambda control will then not be necessary. After a rolling measurement of the flow rates and a cross-comparison of several fuel injection valves, an equalization of the fuel flow rates m* can take place. An otherwise customary or required equalization by way of the quiet(noisy)running/rotational uniformity (non-uniformity) can then be eliminated.

An additional special advantage of the invention is obtained from the following consideration.

Information concerning the stiffness of the piezoelectric actuator 2 may be obtained from the signal supplied by the sensor 3. As a rule, an unsteady form of the signal occurs at the beginning of the injection operation. As a result, the zero point power can be determined; that is, the power which can be impressed on the piezoelectric actuator 2 so that the valve member barely does not yet lift out of the valve seat 6. This information is very important for fast control reactions or for the determination of power balances.

The unsteadiness in the signal form is a result of an unsteadiness in the rigidity course of the piezoelectric actuator 2. It is generated by combustion chamber or fuel pressure changes in the valve member 5 at the beginning of the injection operation and can be detected by the noise of the sensor signal. The same situation exists at the end of the injection operation when the valve member 5 returns onto the valve seat 6.

Correspondingly, by way of the evaluation of the sensor signal, a diagnosis of the injection valve can be carried out. When an injection valve is untight, the combustion chamber pressure causes an admission of force to the valve member and, thus, a sensor signal noise while the valve member 5 is actually inoperative. The cause of the untightness may be a spring break within the injector.

In addition, by comparing the sensor signal forms of different fuel injection valves, the spring prestresses may also be compared among one another.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of controlling a fuel injection valve having a piezoelectric actuator as a valve member, the piezoelectric actuator opening up or closing a connection to a space arranged downstream, an electric actuating element actuates the valve member and a prestressing element prestresses the valve member in a prestressing direction, the control method comprising the acts of:

sensing forces acting upon the valve member via a sensor operatively configured on a same axis as the valve member, the sensor providing an output signal to a control unit; and acting upon the electric actuating element via the control unit by way of an electric excitation, the electric excitation having a signal phase substantially inverse to the output signal of the sensor.

2. The method according to claim 1, wherein, in an initial operating phase, the control unit acts upon actuating elements of several valve members, each equipped with sensor elements independently of one another, the control unit acting upon the actuating elements by way of an electric excitation inverse to the output signal of a respective sensor element.

3. The method according to claim 2, wherein, in an operating phase subsequent to the initial operating phase, the control unit acts upon the actuating elements of the several valve members independently of one another by way of an electric excitation inverse to the output signal of the respective sensor element, and wherein amplitudes of the excitation are selected in correspondence with an output signal of a cylinder-selective lambda sensor.

4. An apparatus for use with a fuel injection valve having a piezoelectric actuator for actuating a valve member, which opens or closes a valve seat, a sensor being arranged on a same axis as the valve member for providing an output signal concerning forces acting upon the valve member, comprising:

a control unit operatively configured to receive the output signal of the sensor concerning the forces acting upon the valve member; and wherein the control unit operates to generate an electric excitation having a signal phase substantially inverse to the output signal received from the sensor, the electric excitation being supplyable to the piezoelectric actuator.

5. The apparatus according to claim 4, wherein, in an initial operating phase, the control unit generates the electric excitation independently for acting upon a piezoelectric actuator of a respective valve member for a plurality of valve members, each equipped with a sensor element; and wherein the electric excitation has a signal phase inverse to the output signal of the respective sensor element for the respective valve member.

6. The method according to claim 1, wherein a position of the piezoelectric actuator is substantially invariable, except during the opening or closing of the connection to the space arranged downstream.

7. The apparatus according to claim 4, wherein a position of the piezoelectric actuator is substantially invariable, except during opening or closing of the valve seat.

* * * * *